US012770703B2

(12) United States Patent
Khwa et al.

(10) Patent No.: US 12,770,703 B2
(45) Date of Patent: Oct. 20, 2026

(54) MEMORY DEVICE AND OPERATING METHOD THEREOF

(71) Applicants: TAIWAN SEMICONDUCTOR MANUFACTURING COMPANY, LTD., Hsinchu (TW); NATIONAL TSING HUA UNIVERSITY, Hsinchu City (TW)

(72) Inventors: Win-San Khwa, Taipei City (TW); De-Qi You, Chiayi County (TW); Jui-Jen Wu, Hsinchu (TW); Meng-Fan Chang, Taichung City (TW)

(73) Assignees: TAIWAN SEMICONDUCTOR MANUFACTURING COMPANY, LTD., Hsinchu (TW); NATIONAL TSING HUA UNIVERSITY, Hsinchu City (TW)

( * ) Notice: Subject to any disclaimer, the term of this patent is extended or adjusted under 35 U.S.C. 154(b) by 205 days.

(21) Appl. No.: 18/435,941

(22) Filed: Feb. 7, 2024

(65) Prior Publication Data

US 2025/0253005 A1 Aug. 7, 2025

(51) Int. Cl.

| | |
|---|---|
| ***G11C 27/00*** | (2006.01) |
| ***G11C 7/10*** | (2006.01) |
| ***G11C 7/12*** | (2006.01) |
| *G11C 7/22* | (2006.01) |
| *H03K 19/20* | (2006.01) |

(52) U.S. Cl.

CPC ............ *G11C 27/00* (2013.01); *G11C 7/1051* (2013.01); *G11C 7/12* (2013.01); *G11C 7/222* (2013.01); *G11C 2207/2254* (2013.01); *H03K 19/20* (2013.01)

(58) Field of Classification Search

CPC .............................................. G11C 2207/2254
USPC ............................................................ 365/45
See application file for complete search history.

(56) References Cited

U.S. PATENT DOCUMENTS

| | | | | |
|---|---|---|---|---|
| 12,087,356 B2 * | 9/2024 | Rawat | ...................... | G11C 8/08 |
| 2023/0395132 A1 * | 12/2023 | Park | ......................... | G11C 7/18 |
| 2024/0211210 A1 * | 6/2024 | Kim | ...................... | G11C 11/419 |

* cited by examiner

*Primary Examiner* — Anthan Tran
(74) *Attorney, Agent, or Firm* — Maschoff Brennan

(57) ABSTRACT

A memory device includes a memory array storing weights; a pre-charging circuit coupled to the memory array through data lines and charging, in response to a pre-charge signal, at least one data line in the data lines to a read voltage in a read operation to one in the weights; and a calibration circuit generating the pre-charge signal according to an address of the one in the weights.

20 Claims, 14 Drawing Sheets

MEMORY DEVICE AND OPERATING METHOD THEREOF

BACKGROUND

Voltage-type read-out scheme for non-volatile memory devices applies the same read pre-charge voltage to bit-lines across different word-line addresses, while neglecting the significant near-far effect of bit-lines, which causes a great deal of extra energy consumption in read operation for a neural network model.

BRIEF DESCRIPTION OF THE DRA WINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
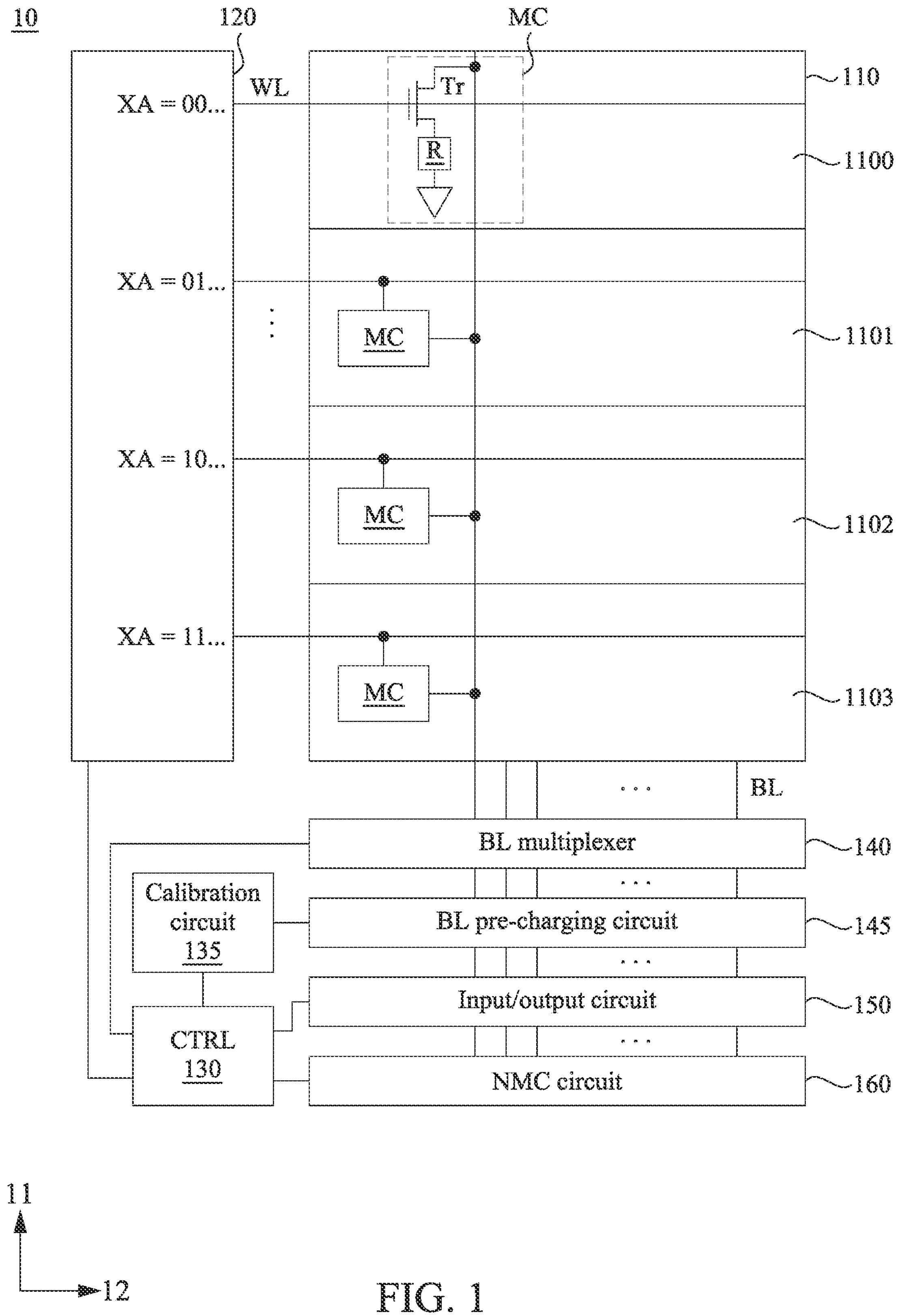
FIG. 1 is a schematic diagram of a memory device in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

This application relates to near-memory-compute (NMC) and/or computing-in-memory (CIM) using neural networks. The neural networks, consisting of interconnected processing nodes, analyze data by computing weights and rely on dot-product and absolute difference computations, typically performed by multiply-accumulate (MAC) operations. Large neural networks face challenges due to the impracticality of storing vast data in processor caches, leading to data transfer bottlenecks. CIM circuits conduct operations locally within memory, reducing data movement between memory and the processor, enhancing throughput, and minimizing energy consumption. CIM devices feature a memory array storing weights, with an input driver generating input signals. The device performs logical operations on selected weights and input signals, including MAC operations, enhancing computational efficiency.

Reference is now made to FIG. 1. FIG. 1 is a schematic diagram of a memory device 10 in accordance with some embodiments of the present disclosure. In some embodiments, the memory device 10 is configured as a compute-in-memory system (CIM) for neural network operations. For illustration, the memory device 10 includes a memory array 110, a word line driver 120, a control circuit 130, a calibration circuit 135, a bit line multiplexer 140, a bit line pre-charging circuit 145, an input/output circuit 150, a near-memory-computing circuit 160.

In some embodiments, the memory array 110 includes multiple memory cells MC in a number N (e.g., N equal to 4) of portions 1100-1103. The portions 1100-1103 are arranged in order along a direction 11 and extend along a direction 12. In some embodiments, for example, the memory cells MC in the portion 1100 to the portion 1103 have low memory addresses XA to high memory addresses XA.

The memory cells MC are at the intersection of rows with columns in the memory array 110. In some embodiments, the memory array 110 includes resistive-based random access memory (RAM) cells. Resistive-based RAM can include resistive-RAM (ReRAM), magnetoresistive RAM (MRAM), ferroelectric RAM (FeRAM), dielectric RAM, any suitable array of any suitable memory devices, or combinations thereof. In the embodiments of FIG. 1, the memory cell MC includes a control transistor Tr and a resistive element R. For illustration, a control terminal of the control transistor Tr is coupled to a corresponding word line WL, a source/drain terminal thereof is coupled to a corresponding bit line BL, and a drain/source terminal thereof is coupled to the resistive element R. The resistive element R is further coupled between the control transistor Tr and a voltage terminal, for example, a ground.

The memory array 110 is configured to store multiple weights. In some embodiments, the memory array 110 stores the weights to certain portions thereof accordingly to how frequently the weights are accessed by a neural network. For example, first to fourth groups of the weights are stored in the portions 1100-1103 along the direction 11 in sequence. The first group of weights in the portion 1100 correspond to frequent access weights that are least accessed by the neural network. The fourth group of weights in the portion 1103 correspond to frequent access weights that are most accessed by the neural network. Similarly, the second group of weights in the portion 1101 correspond to frequent access weights that are the third most accessed by the neural network, and the third group of weights in the portion 1102 correspond to frequent access weights that are the second most accessed by the neural network.

In various embodiments, the weights are stored in certain portions accordingly to what layers in the neural network use the weights. For example, the first group of weights corresponding to weights used for former layers are stored in the portions corresponding to higher memory addresses, for example, portions 1102-1103. On the other hand, the second group of weights corresponding to weights used for latter layers are stored in the portions corresponding to lower memory addresses, for example, portions 1100-1103. In some embodiments, a number of weights used in the former layers is greater than a number of weights used in the latter layers.

The word line driver (WLDR) 120 is coupled to the memory array 110 through word lines WL, and is configured to generate word line signals to drive word lines WL for accessing the memory array 110 to read/write bits of weights from/into the memory array 110 in response to control signal associated with addresses XA, in which the addresses XA indicate some specific memory cells, storing bits, in the memory array 110. Specifically, in some embodiments, the word line driver 120 selects and activates the specific memory cells in the memory array 110 according to the addresses XA.

The control circuit 130 is configured to control the word line driver 120, the calibration circuit 135, the bit line multiplexer 140, the input/output circuit 150, the near-memory-computing circuit 160 to perform either traditional memory access (e.g., read and write of specific addresses), as well as CIM operation. In some embodiments, the control circuit 130 includes an x-decoder to generate the addresses XA for the word lines WL and a y-decoder to generate address, for example, YA, for the bit lines BL. In some embodiments, it also contains timing control for read and write operations. In some embodiments, the control circuit 130 is configured to generate control signals and information for memory operation to the word line driver 120, the calibration circuit 135, the bit line multiplexer 140, and the input/output circuit 150, and the near-memory-computing circuit 160 for access operations (e.g., read operation and write operation to the memory array 110) in response to the addresses.

The bit line multiplexer (MUX) 140 is coupled to the memory array 110 through the bit lines BL (also referred to as data lines) and is configured to enable columns of the memory array 110 by selecting the bit line (BL) based on the control signal associated with the addresses YA, from the control circuit 130.

In some embodiments, the bit line multiplexer 140, the bit line pre-charging circuit 145, and input/output circuit 150 are coupled to each other and to the columns of the memory array 110 through the bit lines BL.

In some embodiments, the word line driver 120, the calibration circuit 135, the bit line multiplexer 140, the 145, and the input/output circuit 150 cooperate to perform read operation to the memory cells MC in the memory array 110. The word line driver 120 selects a word line WL in response to the row address XA, and the bit line multiplexer 140 selects a bit lines BL in response to a column address YA. The calibration circuit 135 is configured to generate the pre-charge signal BLPRE according to the row address XA of the weight. The bit line pre-charging circuit 145 is configured to charge, in response to the pre-charge signal BLPRE, the bit line BL to a predetermined read voltage. During the read operation, voltages of the bit line BL is developed according to a value of the bit, in the weight, stored in the memory cell MC.

The input/output (IO) circuit 150 is configured to transmit data to be written into the memory array 110 and/or to readout data stored in the memory array 110. For example, the input/output circuit 150 includes sense amplifiers SA shown in FIG. 2 configured to sense and amplify the developed voltages of the bit line BL, and readouts stored data. For example, the input/output circuit 150 transmits weights stored in the memory array 110 to the near-memory-computing circuit 160 for further operation.

In some embodiments, the near-memory-computing circuit 160 provides the functional units for performing the MAC operation, such as an adder, multiplier, register, etc.

Figure 2:
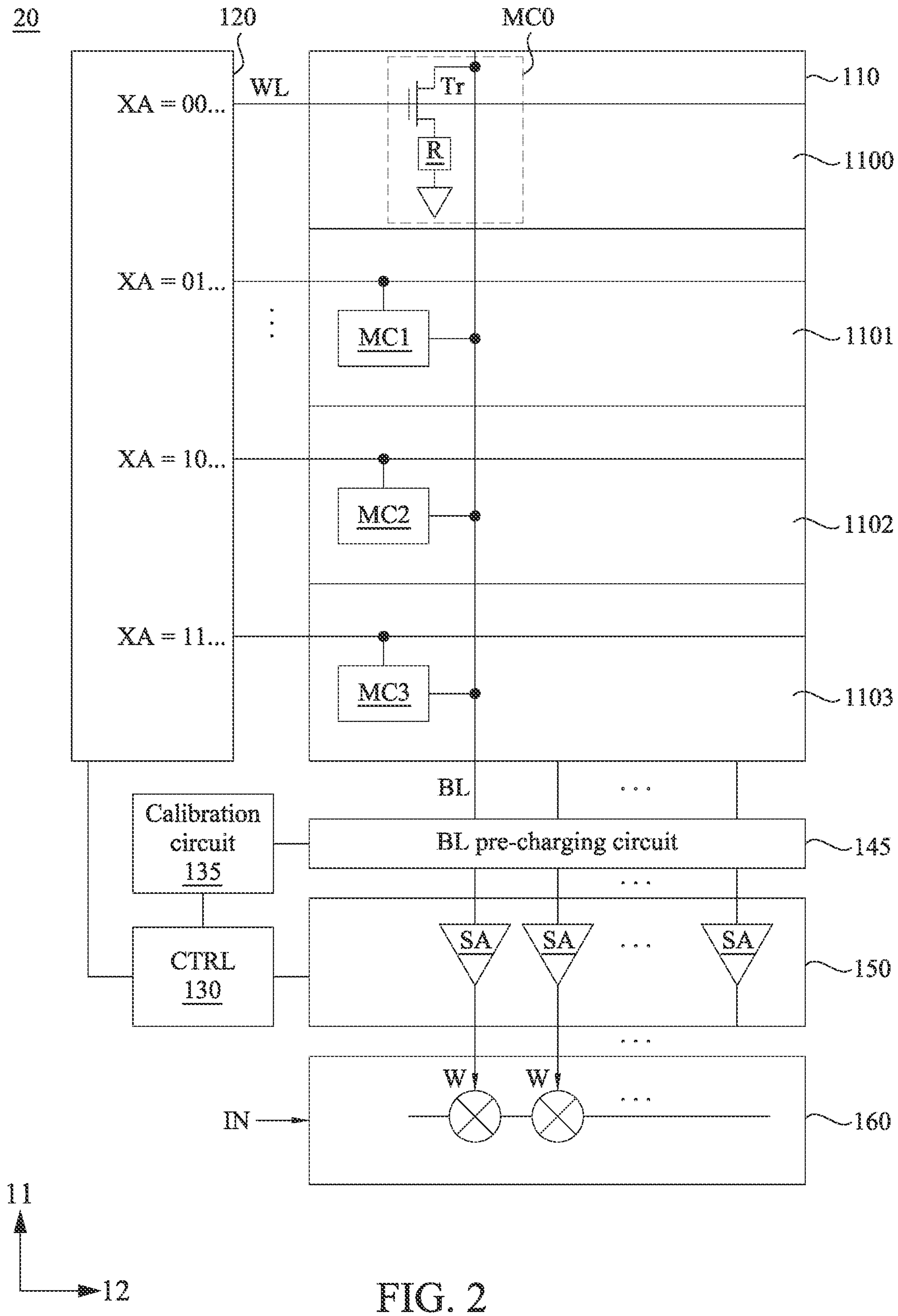
FIG. 2 is a schematic diagram of a memory device corresponding to the memory device shown in FIG. 1, in accordance with some embodiments of the present disclosure.
Figure 3:
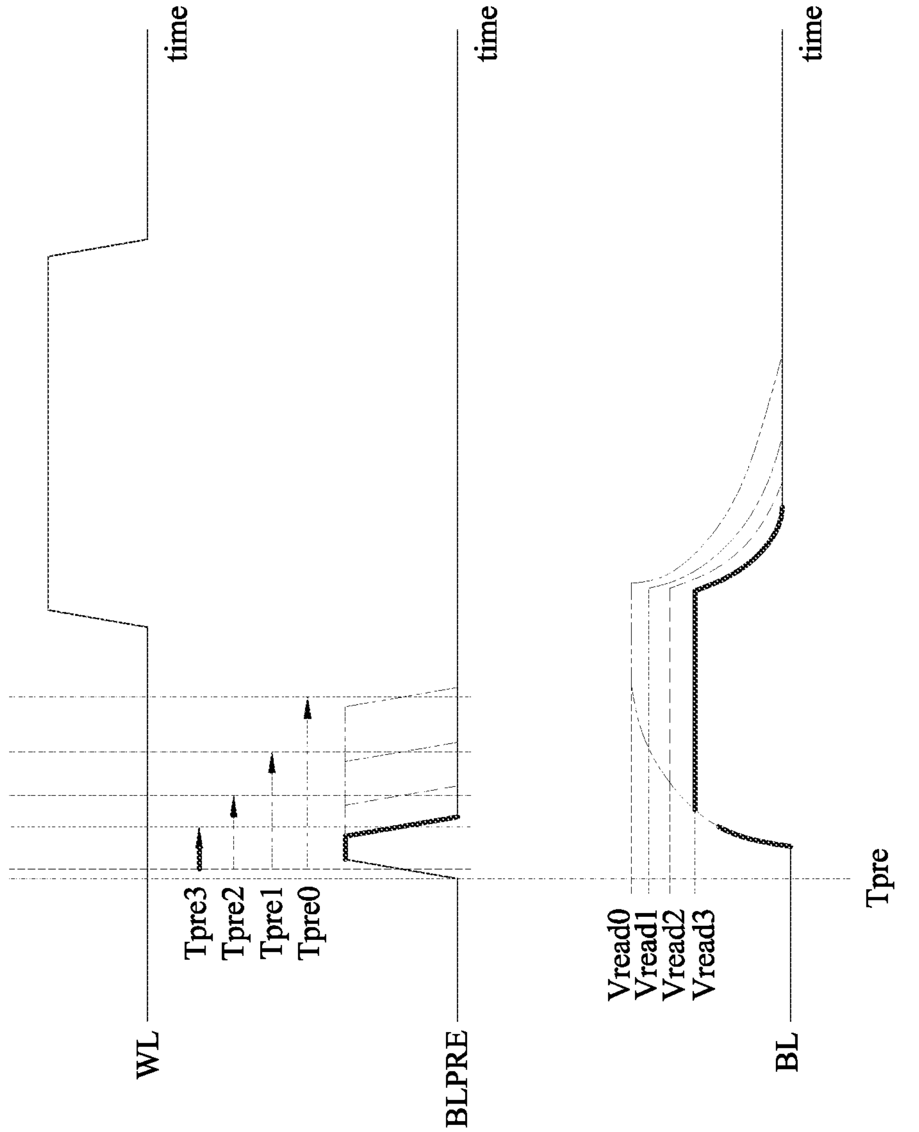
FIG. 3 shows waveforms of signals corresponding to the memory device corresponding to FIGS. 1-2, in accordance with some embodiments of the present disclosure.

Reference is now made to FIGS. 2-3. FIG. 2 is a schematic diagram of a memory device 20 corresponding to the memory device 10 shown in FIG. 1, and FIG. 3 shows waveforms of signals corresponding to the memory device corresponding to FIGS. 1-2, in accordance with some embodiments of the present disclosure. With respect to the embodiments of FIG. 1, like elements in FIGS. 2-3 are designated with the same reference numbers for ease of understanding. The specific operations of similar elements, which are already discussed in detail in above paragraphs, are omitted herein for the sake of brevity. In some embodiments, the memory device 20 is configured with respect to, for example, the memory device 10 of FIG. 1. The memory cells MC0-MC3 are configured with respect to, for example, the memory cell MC of FIG. 1.

As shown in FIGS. 2-3, the memory cells MC0-MC3 are arranged in the portions 1100-1103 separately and coupled to the bit line BL. In some embodiments, the bit line pre-charging circuit 145 is configured to charge, in response to the pre-charge signal BLPRE, the bit line BL for different durations, for example, durations Tpre0-Tpre3, according to the position of the memory cells storing the weight being read. The sense amplifiers SA in the input/output circuit 150 further readout the data of the weight according to the developed voltage of the bit line BL.

For example, as shown in FIG. 3, the bit line pre-charging circuit 145 charges the bit line BL for the duration Tpre0 in the read operation to memory cells MC0 in the portion 1100, and charges the bit line BL for the duration Tpre3 in the read operation to memory cells MC3 in the portion 1103, in which the duration Tpre3 is shorter than the duration Tpre0 while the portion 1103 is arranged closer to the bit line pre-charging circuit 145 and the input/output circuit 150 than the portion 1100. Alternatively stated, the larger the distance between the memory cell MC and the bit line pre-charging circuit 145 and/or the input/output circuit 150, the longer the bit line pre-charging circuit 145 charges the bit line BL. Because the charging duration is proportional to a voltage value of the bit line BL in the read operation, to state in another way, the farther memory cell MC is away from the pre-charging circuit 145 and/or the input/output circuit 150 along the direction 11, the higher the read voltage the bit line pre-charging circuit 145 charges the bit line BL to reach for the read operation.

Specifically, the bit line pre-charging circuit 145 charges, in response to the pre-charge signal BLPRE generated from the calibration circuit 135. In some embodiments, the calibration circuit 135 is configured to generate, according to the row address XA of the weight, the pre-charge signal BLPRE having different pulse widths in the read operations performed to the memory cells MC0-MC3 separately.

For example, the portion 1100 is the farthest to the bit line pre-charging circuit 145 and the input/output circuit 150 among the portions 1100-1103 along the direction 11. In a read operation to the weight stored in memory cells (e.g., MC0) coupled to the word line WL corresponding to the row address XA[MSB:MSB−1]=00, the calibration circuit 135 generates accordingly the pre-charge signal BLPRE to the bit line pre-charging circuit 145, MSB referring to as a most significant bit. As shown in FIG. 3, the bit line pre-charging circuit 145 further charges the bit line BL for the duration Tpre0 to reach a voltage value Vread0 as the read voltage.

Similarly, in a read operation to the weight stored in memory cells (e.g., MC1) coupled to the word line WL corresponding to the row address XA[MSB:MSB−1]=01, the calibration circuit 135 generates accordingly the pre-charge signal BLPRE. As shown in FIG. 3, the bit line pre-charging circuit 145 further charges the bit line BL for the duration Tpre1 to reach a voltage value Vread1 as the read voltage. In some embodiments, the duration Tpre1 is shorter than the duration Tpre0, and the voltage value Vread1 is smaller than the voltage value Vread0.

As for the read operation to the weight stored in memory cells (e.g., MC2) coupled to the word line WL corresponding to the row address XA[MSB:MSB−1]=10, the calibration circuit 135 generates accordingly the pre-charge signal BLPRE. The bit line pre-charging circuit 145 further charges the bit line BL for the duration Tpre2 to reach a voltage value Vread2 as the read voltage. In some embodiments, the duration Tpre2 is shorter than the duration Tpre1, and the voltage value Vread2 is smaller than the voltage value Vread1.

As shown in FIG. 2, the portion 1103 is the closest to the bit line pre-charging circuit 145 and the input/output circuit 150 among the portions 1100-1103 along the direction 11. In the read operation to the weight stored in memory cells (e.g., MC3) coupled to the word line WL corresponding to the row address XA[MSB:MSB−1]=11, the calibration circuit 135 generates accordingly the pre-charge signal BLPRE. The bit line pre-charging circuit 145 further charges the bit line BL for the duration Tpre3 to reach a voltage value Vread3 as the read voltage. In some embodiments, the duration Tpre3 is shorter than the duration Tpre2, and the voltage value Vread3 is smaller than the voltage value Vread2.

In some embodiments, after the bit line BL is charged to the predetermined read voltage, as shown in FIG. 3, the word line driver 120 selects the word line WL by the rising the voltage level on the word line WL to turn on the control transistor Tr in the memory cell. Voltage of the bit line BL is developed according to a value of the bit, in the weight, stored in the memory cell. The sense amplifier SA further readouts the data according to, the discharge speed of the bit line BL, the current on the bit line BL, or other suitable read scheme in memory read operation.

With continued reference to FIG. 2, similarly aforementioned embodiments of reading one bit of the weight, the control circuit 130 controls the word line driver 120, the calibration circuit 135, the bit line pre-charging circuit 145, and the input/output circuit 150 to sequentially read out all the bits of the weights, for example, W[N−1:0] from N memory cells in the memory array 110 to the near-memory-computing circuit 160, N being positive integer. In some embodiments, the near-memory-computing circuit 160 is configured to bit-serial multiplication of the input IN and the weight W from a most significant bit (MSB) of the input to a least significant bit (LSB) of the input signal IN, thus producing a plurality of partial-products. The product output of the near-memory-computing circuit 160 is provided to a one IO adder circuit (not shown) or other suitable computation circuit.

Figure 4:
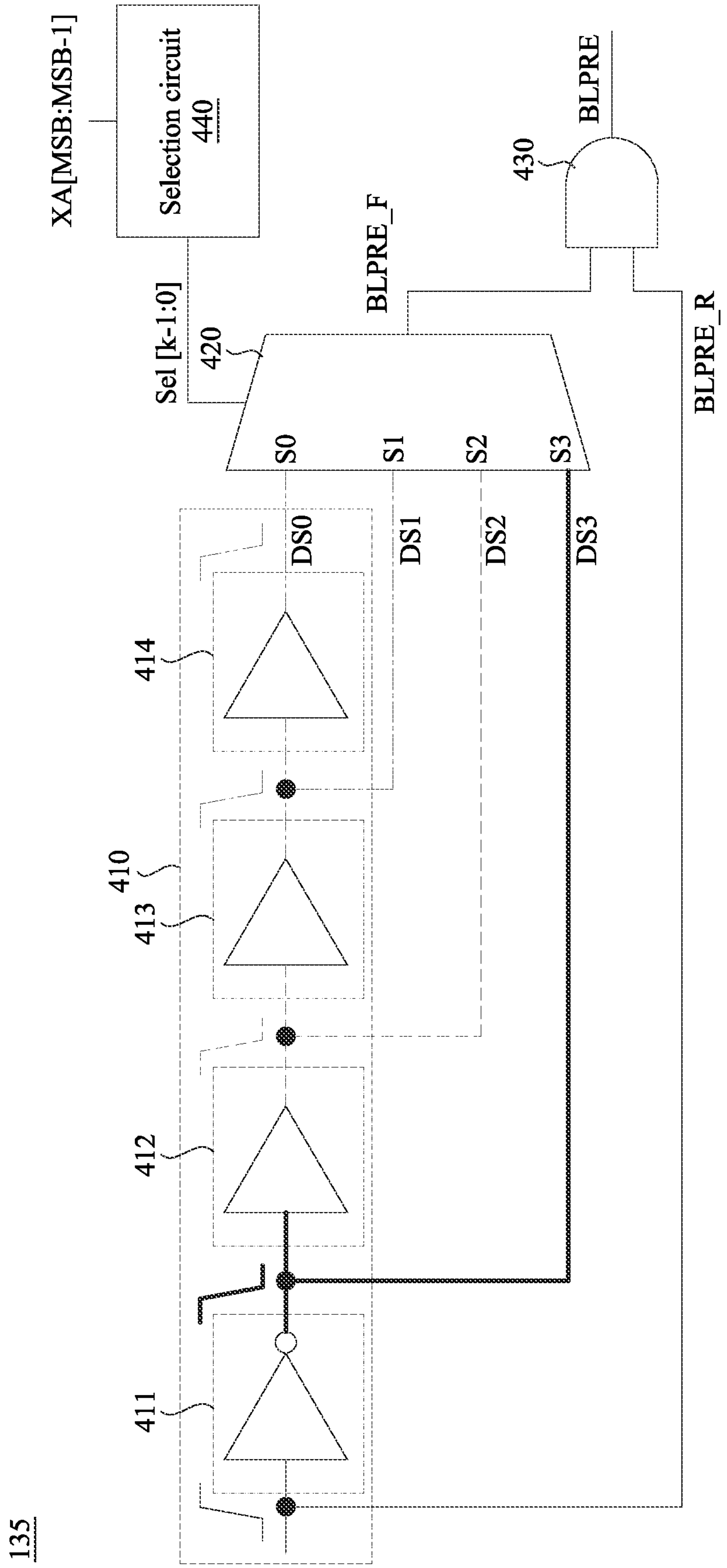
FIG. 4 is a schematic diagram of a calibration circuit in the memory device shown in FIGS. 1-2, in accordance with some embodiments of the present disclosure.

Reference is now made to FIG. 4. FIG. 4 is a schematic diagram of the calibration circuit 135 in the memory device shown in FIGS. 1-2, in accordance with some embodiments of the present disclosure.

For illustration, the calibration circuit 135 includes a delay chain 410, a multiplexer circuit 420, a logic circuit 430, and a selection circuit 440. In some embodiments, the logic circuit 430 is implemented by an AND gate.

The delay chain 410 is configured to generate the delay signals DS0-DS3 in response to a signal BLPRE_R. in some embodiments, the delay chain 410 includes delay units 411-414 coupled in series with each other. The delay unit 411 includes an inverter configured to generate the delay signal DS3 by inverting the signal BLPRE_R. Each of the delay units 412-414 includes a buffer that is configured to delay a corresponding one of the delay signals DS3, DS2, and DS1 and accordingly generates a corresponding one of the delay signals DS2, DS1 and DS0.

The multiplexer circuit 420 is configured to receive the delay signals DS0-DS3 at input terminals S0-S3 and outputs, in response to a selection signal Sel, one of the delay signals DS0-DS3 as a signal BLPRE_F. In some embodiments, the selection signal Sel is generated by the selection circuit 440 and associated with the address of the weight to be read. In some embodiments, the selection circuit 440 generates the selection signal Sel[k−1:0] based on at least a calibration table and the address Addr (e.g., address of the weight to be read). In some embodiments, the calibration table includes the address and value of the selection signal Sel and indicates a one-to-one correlation between the address and the selection signal Sel. For example, the selection circuit 440 generates a corresponding selection signal Sel[k−1:0] based on the address XA[MSB:MSB−1]. In some embodiments, the number k corresponds to an exponent of the number N of portions in the memory array 110, N being of the form $2^k$.

The logic circuit 430 is configured to generate the pre-charge signal BLPRE in response to the signal BLPRE_R and the signal BLPRE_F. For example, the logic circuit 430 performs an AND operation of the signal BLPRE_R and the signal BLPRE_F to generate the pre-charge signal BLPRE.

Figure 5:
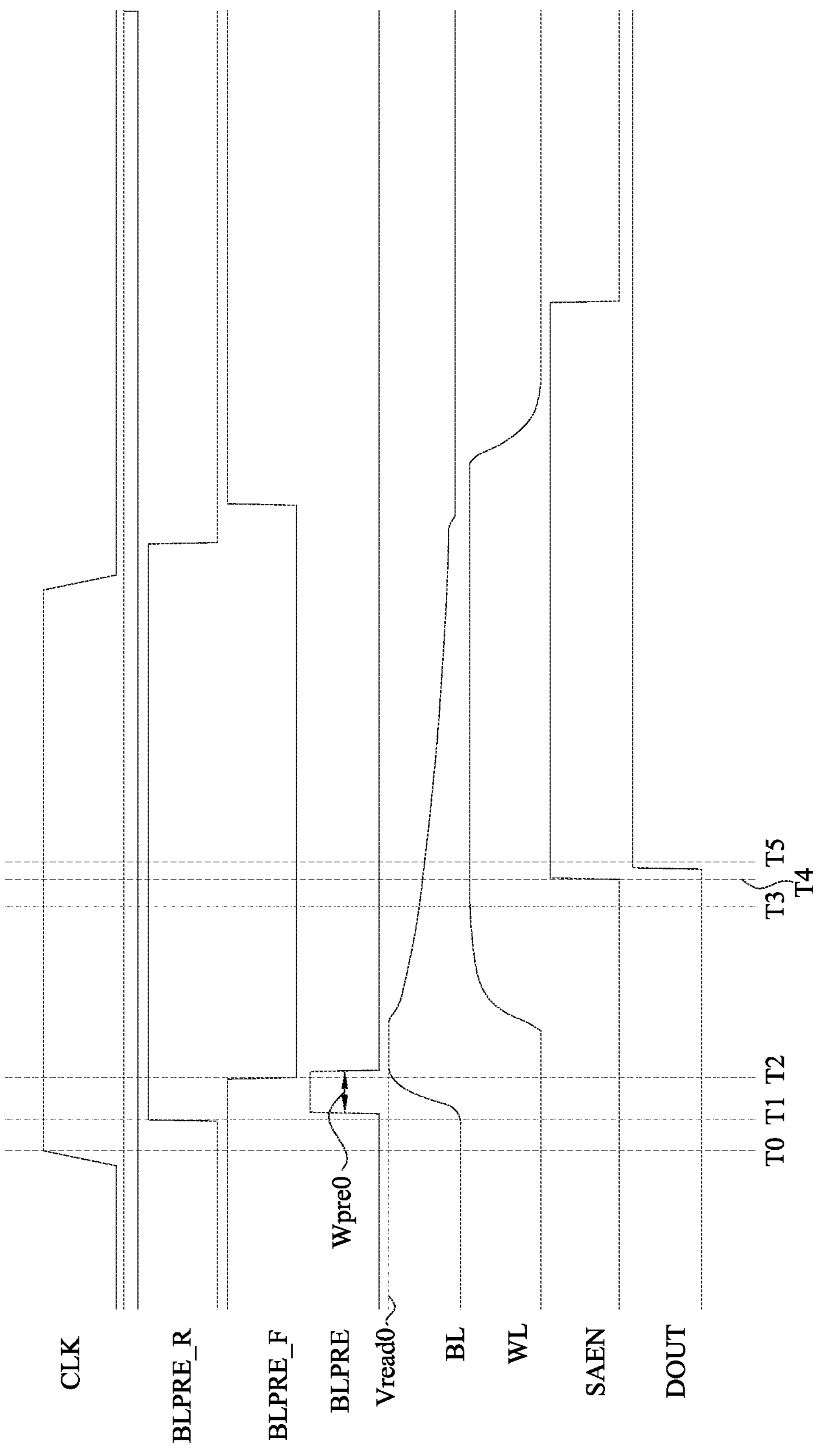
FIG. 5 is a schematic diagram of a selection circuit in the calibration circuit shown in FIG. 4, in accordance with some embodiments of the present disclosure.

In operations, for example, with reference to FIGS. 2-4 and FIG. 5 illustrating waveforms of signals, at time T0, the memory device 20 operates in response to the clock signal CLK to perform the read operation to read a bit of the weight stored in the portion 1100 of FIG. 2. As shown in FIG. 5, the selection circuit 440 generates the selection signal Sel[k−1:0] in response to the address XA[MSB:MSB−1]=00 to control the multiplexer circuit 420 to output the delay signal DS0 as the signal BLPRE_F. At time T1 to time T2 the logic circuit 430 generates the pre-charge signal BLPRE having a pulse width Wpre0. The bit line pre-charging circuit 145 further charges the bit line BL to the voltage value Vread0. At time T3, the control transistor Tr in the memory cell MC0 turns on in response to the voltage level on the word line WL rising. At time T4, the sense amplifier SA in the input/output circuit 150 senses the bit line BL in response to the enable signal SAEN rising and further outputs data out signal DOUT indicating the bit of the weight to be read at time T5.

Figure 6:
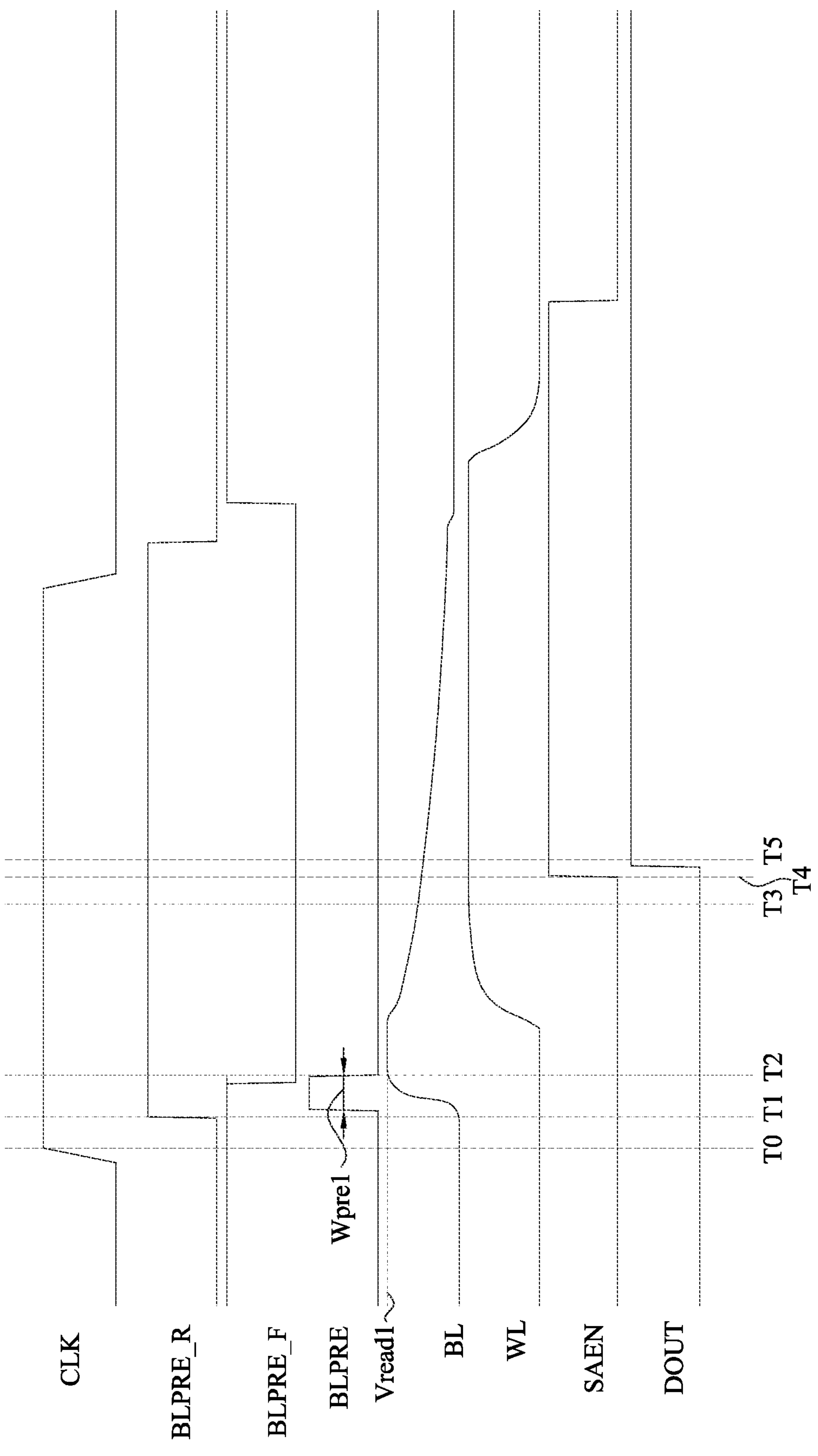
FIG. 6 shows waveforms of signals corresponding to FIGS. 1-5, in accordance with some embodiments of the present disclosure.

Compared with the read operation of the weight stored in the portion 1100, in the embodiments of reading the weight stored in the portion 1101 of FIG. 2, as shown in FIG. 6, instead of outputting the delay signal DS0, the selection circuit 440 generates the selection signal Sel[k−1:0] in response to the address XA[MSB:MSB−1]=01 to control the multiplexer circuit 420 to output the delay signal DS1 as the signal BLPRE_F. At time T1 to time T2 the logic circuit 430 generates the pre-charge signal BLPRE having a pulse width Wpre1. In some embodiments, the pulse width Wpre1 is smaller than the pulse width Wpre0. The bit line pre-charging circuit 145 further charges the bit line BL to the voltage value Vread1 smaller than the voltage value Vread0.

Figure 7:
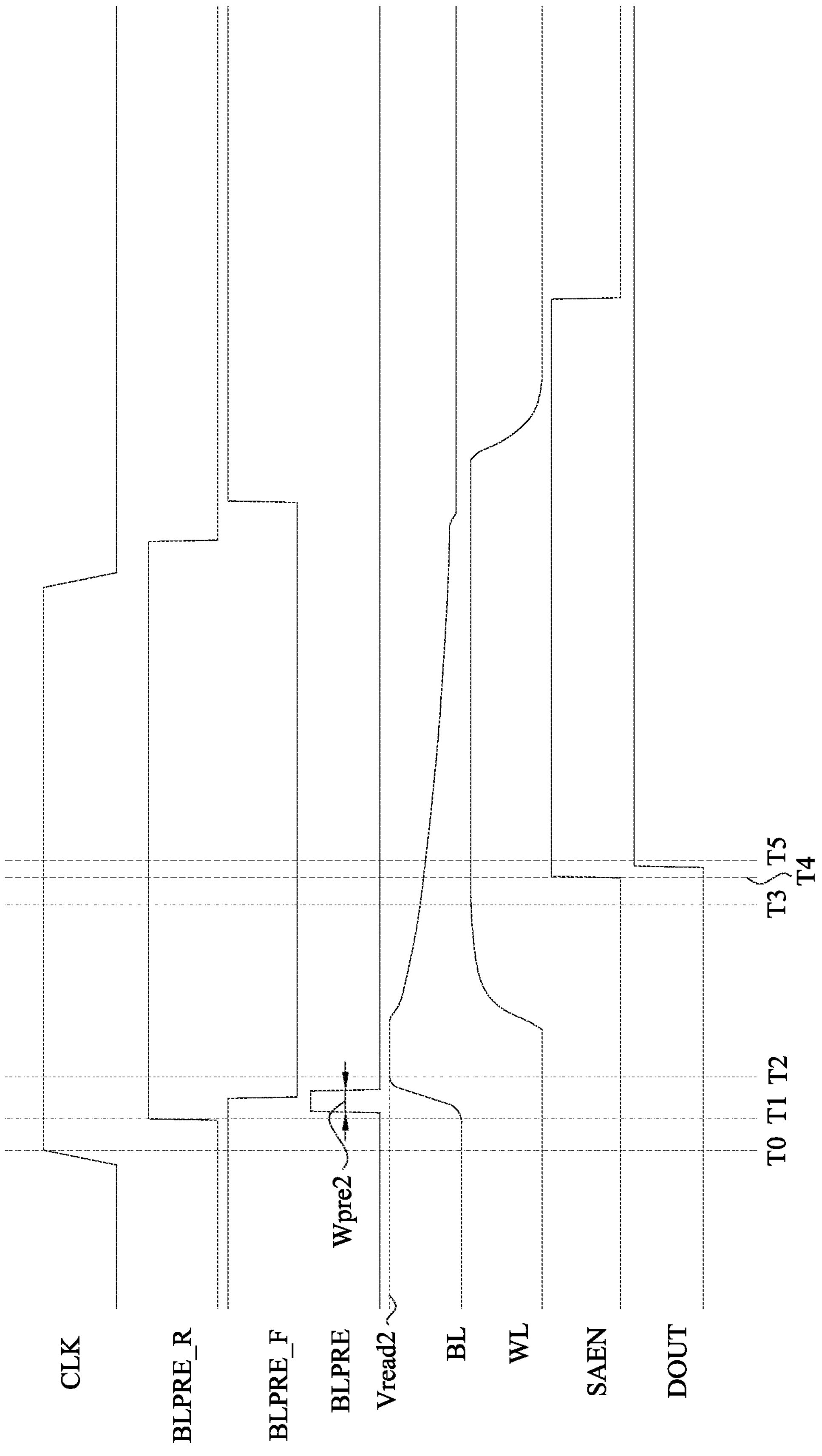
FIG. 7 shows waveforms of signals corresponding to FIGS. 1-5, in accordance with some embodiments of the present disclosure.

Reference is now made to FIG. 7. Compared with the read operation of the weight stored in the portion 1101, in the embodiments of reading the weight stored in the portion 1102 of FIG. 2, instead of outputting the delay signal DS1, the selection circuit 440 generates the selection signal Sel[k−1:0] in response to the address XA[MSB:MSB−1]=10 to control the multiplexer circuit 420 to output the delay signal DS2 as the signal BLPRE_F. At time T1 to time T2 the logic circuit 430 generates the pre-charge signal BLPRE having a pulse width Wpre2. In some embodiments, the pulse width Wpre2 is smaller than the pulse width Wpre1. The bit line pre-charging circuit 145 further charges the bit line BL to the voltage value Vread2 smaller than the voltage value Vread1.

Figure 8:
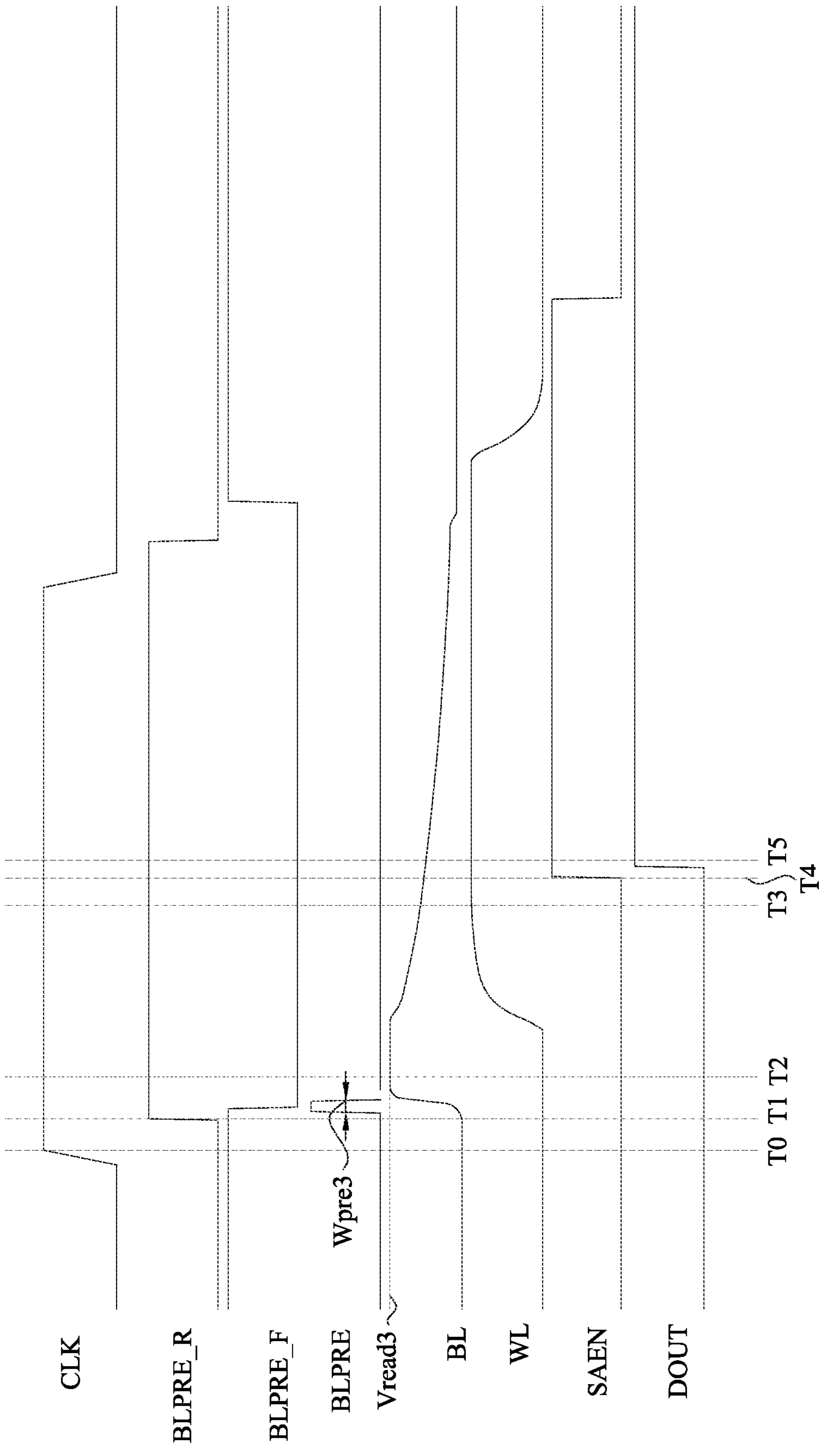
FIG. 8 shows waveforms of signals corresponding to FIGS. 1-5, in accordance with some embodiments of the present disclosure.

Reference is now made to FIG. 8. Compared with the read operation of the weight stored in the portion 1102, in the embodiments of reading the weight stored in the portion 1103 of FIG. 2, instead of outputting the delay signal DS2, the selection circuit 440 generates the selection signal Sel[k−1:0] in response to the address XA[MSB:MSB−1]=11 to control the multiplexer circuit 420 to output the delay signal DS3 as the signal BLPRE_F. At time T1 to time T2 the logic circuit 430 generates the pre-charge signal BLPRE having a pulse width Wpre3. In some embodiments, the pulse width Wpre3 is smaller than the pulse width Wpre2. The bit line pre-charging circuit 145 further charges the bit line BL to the voltage value Vread3 smaller than the voltage value Vread2.

In some approaches, the pre-charge voltage, for example, around 0.3 Volts, applied on the bit line is the same and set for proper read operation of various weights that correspond to different word line addresses and stored in portions of the memory array various distances away from the input/output circuit. However, due to the near-far-effect of the bit line-RC loading of the bit line BL is proportional to the square of the distances between the input/output circuit and the accessed memory, applying uniform pre-charge voltage for all the read operations regardless the positions of the memory cells causes a great deal of extra energy consumption in read operation.

With the configurations of the present application, the bit line pre-charging circuit 145 charges the bit line BL to various read voltage according to the row address XA corresponding to the position of the access memory cells storing the weight to be read in read operation, reducing read energy by around 40% to 60%. For example, in some embodiments of accessing weights stored in all portions, for example, 1100-1103 in an uniform readout ratio with the voltage values Vread0-Vread3 being 0.30 Volts, 0.25 Volts, 0.20 Volts, and 0.15 Volts, reduction of the read energy is derived from $25\%\times(0.15/0.3)^2+25\%\times(0.2/0.3)^2+25\%\times(0.25/0.3)^2+25\%\times(0.3/0.3)^2\approx60\%$. In another embodiments of accessing weights stored in all portions, for example, 1100-1103 in an asymmetric readout ratio, reduction of the read energy is derived from $50\%\times(0.15/0.3)^2+36\%\times(0.2/0.3)^2+13\%\times(0.25/0.3)^2+1\%\times(0.3/0.3)^2\approx40\%$.

Figure 9A:
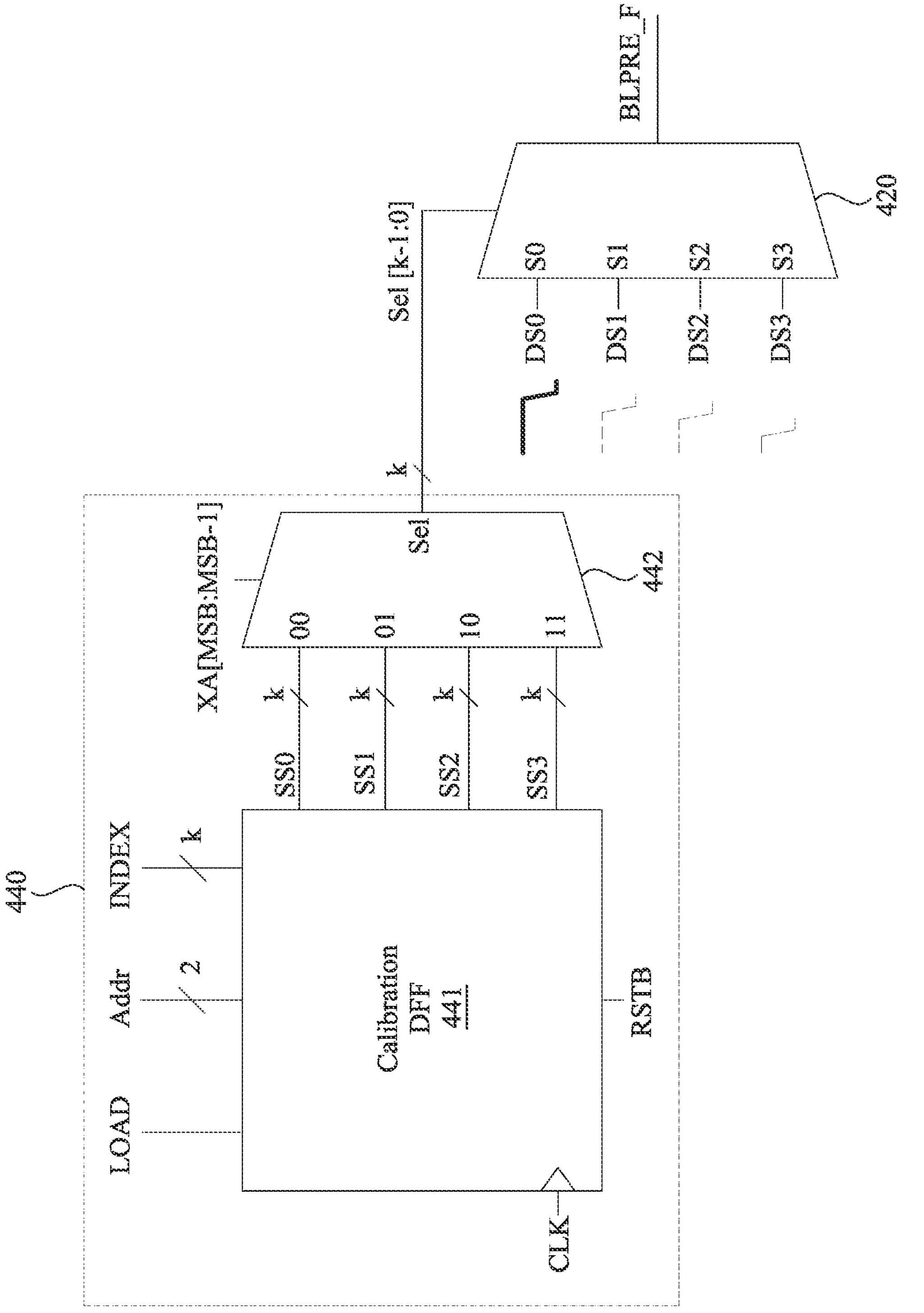
FIG. 9A is a schematic diagram of the selection circuit and the multiplexer circuit in FIG. 4, in accordance with some embodiments of the present disclosure.

Reference is now made to FIG. 9A. FIG. 9A is a schematic diagram of the selection circuit 440 and the multiplexer circuit 420 in the calibration circuit 135 shown in FIG. 4, in accordance with some embodiments of the present disclosure. In some embodiments, the flip-flop circuit 441 is configured to store the data of the calibration table and to output signals SS0-SS3 of k bits to the multiplexer circuit 442 in response to a signal LOAD and a clock signal CLK. The clock signal CLK is configured for positive-edge triggered D flip-flops in the flip-flop circuit 441. In some embodiments, the data of the calibration table consist of a one-on-one mapping between the address Addr and index transmitted through the index signal INDEX of k bits. In some embodiments, the address Addr could be the address XA[MSB:MSB−1]. In some embodiments, a signal RSTB is configured for an active-low reset for the D flip-flops in the flip-flop circuit 441.

In operation according to some embodiments, the signal LOAD controls an operation mode of the flip-flop circuit 441. For example, when the signal LOAD has a first logic number, "0", the flip-flop circuit 441 operates in a loading mode. When the signal LOAD has a second logic number, "1", the flip-flop circuit 441 operates in a holding mode.

In some embodiments, during the loading mode, the address Addr of, for example, 2 bits, controls the index of the index signal INDEX loading in the flip-flop circuit 441. During the holding mode, k-bit index data are output through signals SS0-SS4 to the multiplexer circuit 442.

The multiplexer circuit 442 is coupled to the flip-flop circuit 441 and configured to transmit, in response to the address XA[MSB:MSB−1], corresponding one in the signals SS0-SS4 as the selection signal Sel of k bits to the multiplexer circuit 420.

Figure 9C:
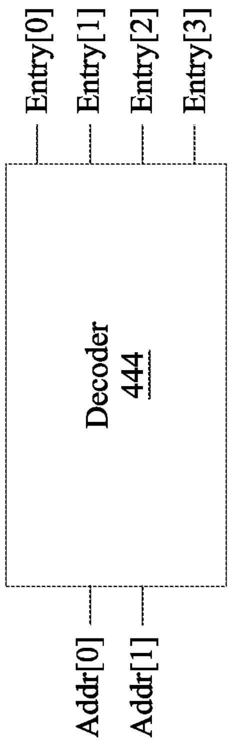
FIGS. 9B-9D show the components in the flip-flop circuit of FIG. 9A, in accordance with some embodiments of the present disclosure.
Figure 9B:
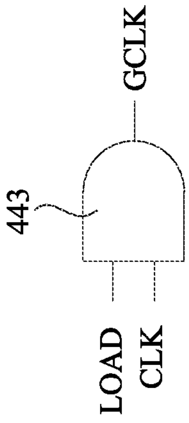
Figure 9D:
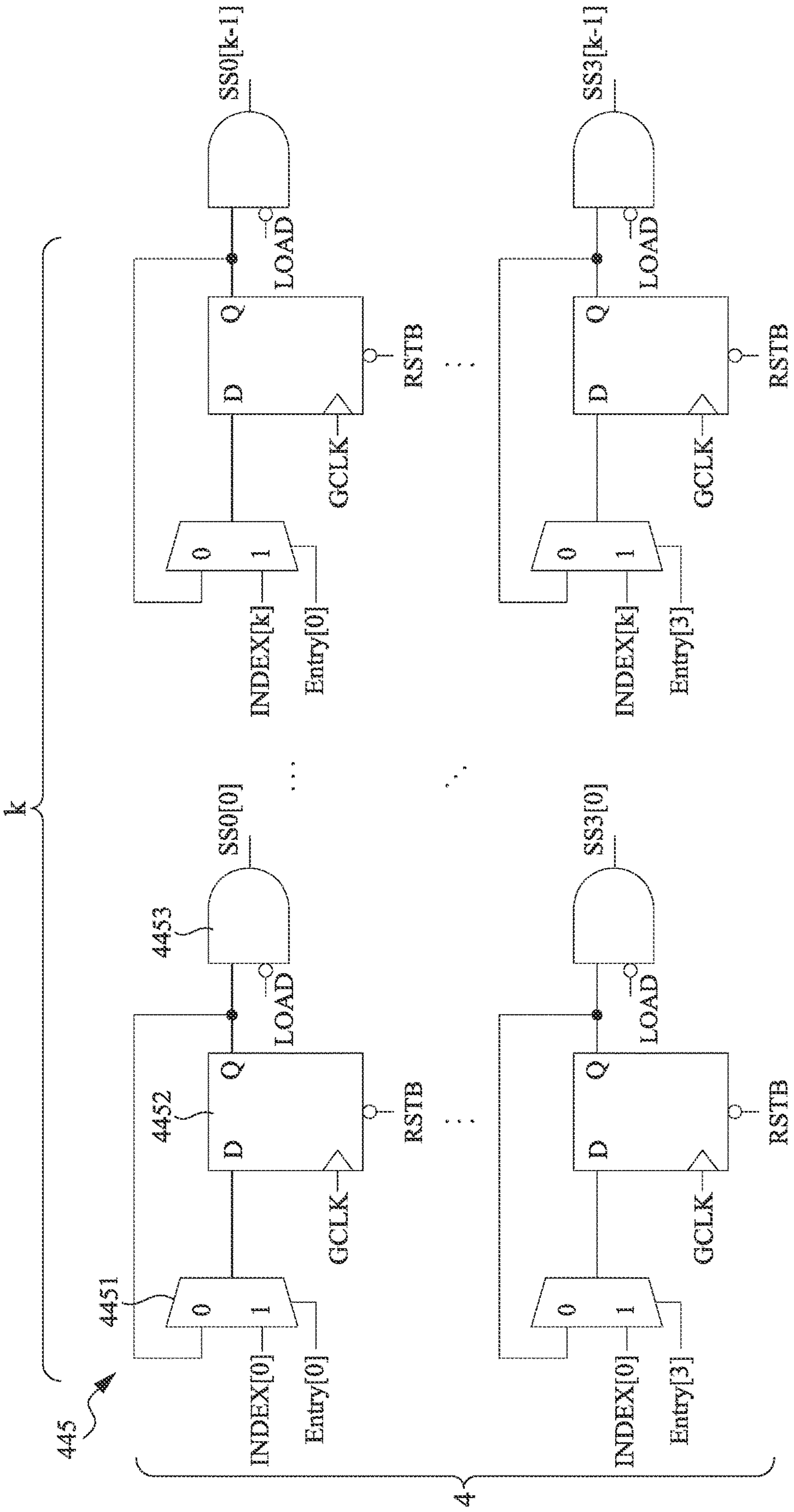

Reference is now made to FIGS. 9B-9D. FIGS. 9B-9D show the components in the flip-flop circuit 441 of FIG. 9A, in accordance with some embodiments of the present disclosure.

As shown in FIGS. 9B-9D, the flip-flop circuit 441 includes a logic circuit 443, a decoder 444, and circuits 445. In the embodiments of FIG. 9B, the logic circuit 443 is an AND gate and configured to generate a clock signal GCLK in response to the signal LOAD and the clock signal CLK. In FIG. 9C, the decoder 444 is a two-to-four decoder and configured to generate a signal Entry of 4 bits in response to 2-bit address Addr.

In some embodiments of FIG. 9D, the flip-flop circuit 441 includes a number of 4 timing k of the circuits 445, in which the number k corresponds to an exponent of the number N of portions in the memory array 110, N being of the form $2^k$. For illustration, each of the circuit 445 includes a multiplexer 4451, a flip flop 4452, and a logic circuit 4453 (e.g., for example, an AND gate.) The flip flop 4452 is coupled between the multiplexer 4451 and the logic circuit 4453.

In operation, each circuit 445 is configured to generate a corresponding bit data in a corresponding one of the signal SS0-SS3, in response to the clock signal GCLK, the signal LOAD, and corresponding bits in the index signal INDEX and the signal Entry. For example, the multiplexer 4451 has a first input coupled to a Q output of the flip flop 4452 and a second input receive a bit in the index signal INDEX, for example, INDEX[0]. The multiplexer 4451 further outputs, in response to a corresponding bit, for example, Entry[0], one of bits received from two input thereof to a D input of the flip flop 4452. The flip flop 4452 outputs the bit received from the D input in response to the clock GCLK to the Q output. The logic circuit 4453 has a first input coupled to the Q output and a second input receiving a signal inverted from the signal LOAD. The logic circuit 4453 outputs a corresponding bit, for example, SS0[0]. The configurations of other circuits 445 are similar to the aforementioned one. Hence, the repetitious descriptions are omitted here.

The configurations of FIGS. 1-9D are given for illustrative purposes. Various implements are within the contemplated scope of the present disclosure. For example, in some embodiments, the memory array can have a number, less or more than 4, of different portions to store weights, and the bit line pre-charging circuit charges the bit line to the number of different read voltages according to addresses of the weights. Alternatively stated, a number of various read voltages that the bit line pre-charging circuit charges the bit line BL is associated with a number of the divisions of weights in the memory array. Similarly, for generating the pre-charge signal BLPRE in response to different number of the divisions of weights, a number of the delay units in the delay chain 410 for generating the delay signals, for example, DS0-DS3, is associated with a the number of the divisions of weights.

Figure 10:
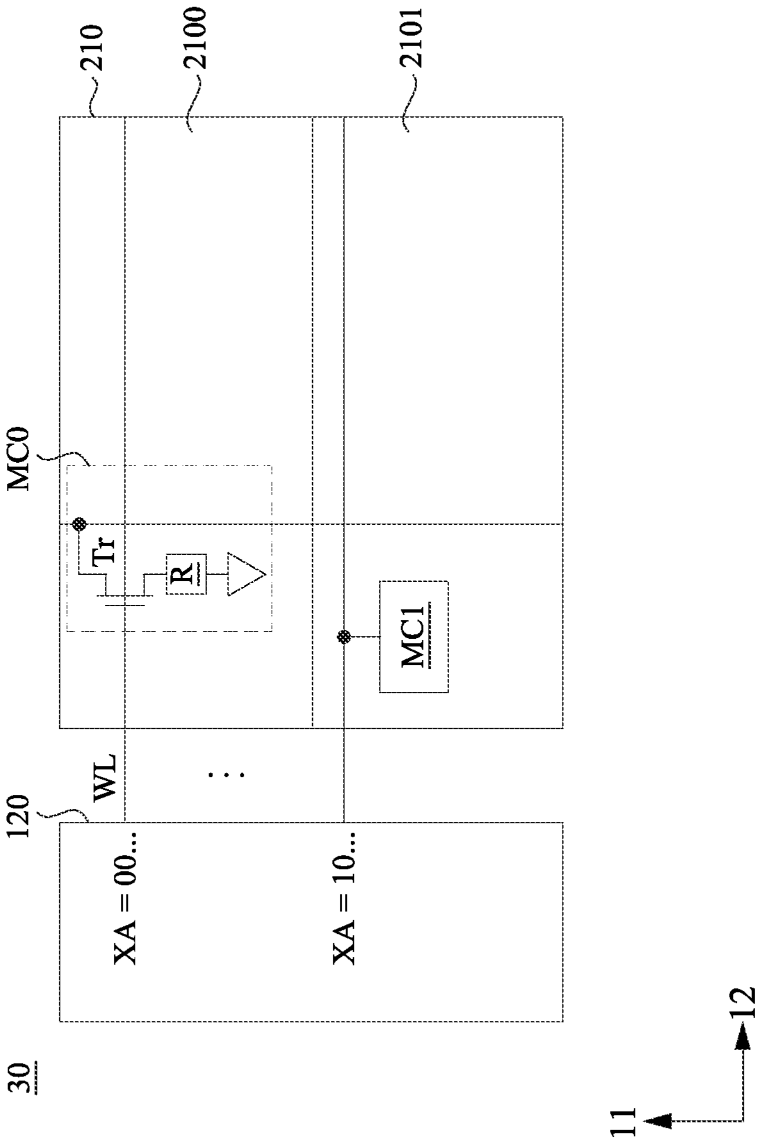
FIG. 10 is a schematic diagram of a memory device in accordance with some embodiments of the present disclosure.

For example, reference is now made to FIG. 10. FIG. 10 is a schematic diagram of a memory device 30 in accordance with some embodiments of the present disclosure. In some embodiments, the memory device 30 is configured with respect to, for example, the memory device of FIGS. 1-2. For the sake of brevity, peripheral circuits in the memory device 30 are not shown in FIG. 10.

For illustration, the memory device 30 includes a memory array 210 having two portions 2100-2101. In some embodiments, the calibration circuit 135 generates the pre-charge signal BLPRE according to the most significant bit of the row address XA, for example, XA[MSB] corresponding to the weight to be read. The bit line pre-charging circuit 145 further charges the bit line BL for two different durations in response to the pre-charge signal BLPRE having two different pulse widths.

Figure 11:
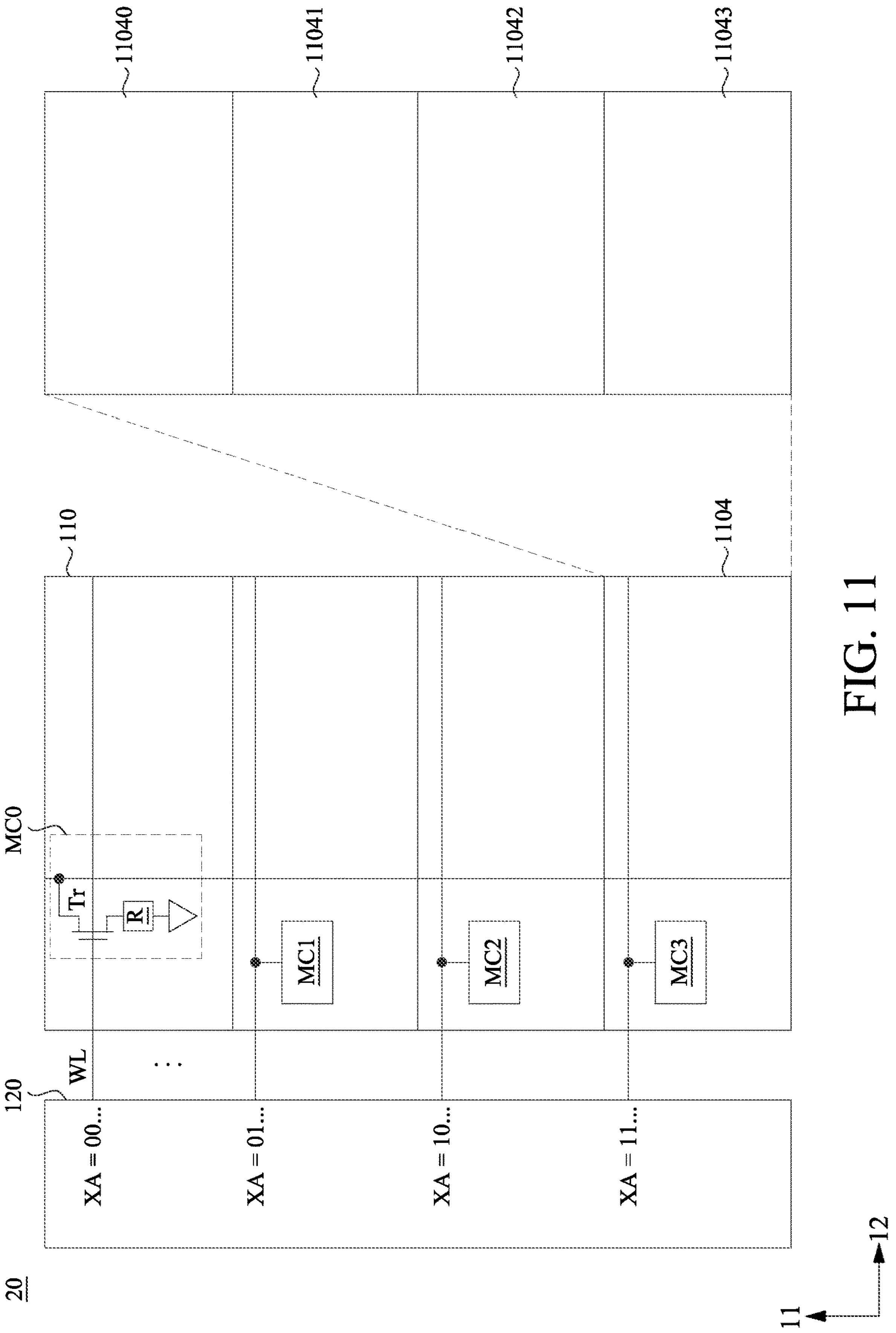
FIG. 11 is a schematic diagram of a memory device corresponding to the memory device shown in FIG. 1, in accordance with some embodiments of the present disclosure.

Reference is now made to FIG. 11. In some embodiments, the memory array 110 is further configured to store bits of the weights to certain portions thereof accordingly to how frequently bits are accessed by the neural network. In some embodiments, the bit that is least accessed by the neural network is stored in a portion farther from the bit line pre-charging circuit 145 and the input/output circuit 150 than the bit that is most accessed by the neural network.

For example, in some embodiments, a most significant bit (MSB) of a certain weight is the most accessed bit and is accordingly stored in a first one of memory cells (e.g., MC3) in the portion 11043. On the other hand, a least significant bit (LSB) of the certain weight is the least accessed bit and is stored in a second one of memory cells (e.g., MC3) in the portion 11040. The first and second ones of the memory cells are a first distance and a second distance apart from the pre-charge circuit 145 and/or the input/output circuit 150 respectively, and the first distance is shorter than the second distance.

The configurations of FIG. 11 are given for illustrative purposes. Various implements are within the contemplated scope of the present disclosure. For example, in some embodiments, each of the other portions, for example, 1100-1103 have the configurations the same as the portion 1104.

Figure 12:
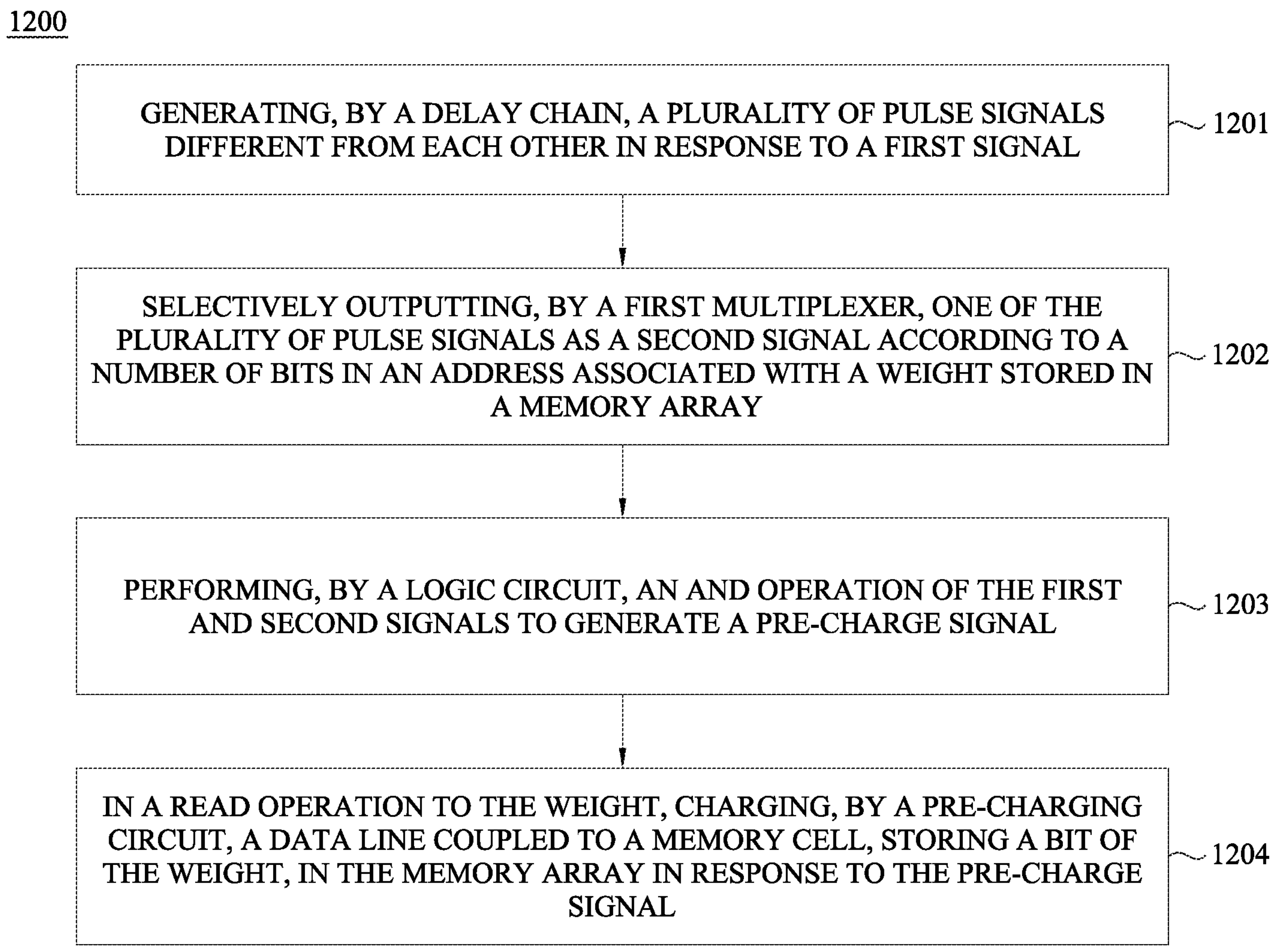
FIG. 12 is a flowchart diagram of a method for operating the memory devices shown in FIGS. 1-11, in accordance with some embodiments of the present disclosure.

Reference is now made to FIG. 12. FIG. 12 is a flowchart diagram of a method 1200 for operating the memory device 10, 20, or 30, in accordance with some embodiments. It is understood that additional operations can be provided before, during, and after the processes shown by FIG. 12, and some of the operations described below can be replaced or eliminated, for additional embodiments of the method. The order of the operations/processes may be interchangeable. Throughout the various views and illustrative embodiments, like reference numbers are used to designate like elements. The method 1200 includes operations 1201-1204 that are described below with reference to the memory device 10, 20, or 30 corresponding to FIGS. 1-11.

In operation 1201, as shown in FIG. 4, the delay chain 410 generates the delay signals DS0-DS3 different from each other in response to the signal BLPRE_R.

In some embodiments, the method 1200 further includes operations of inverting, by the delay unit 411, the signal BLPRE_R to generate the delay signal DS3 and sequentially delaying the delay signal DS3 to generate remaining delay signals DS2, DS1, and DS0.

In operation 1202, the multiplexer selectively outputs one of the delay signals DS0-DS3 as the signal BLPRE_F according to a number of bits, for example, XA[MSB,MSB−1] in the row address XA associated with the weight stored in the memory array.

In some embodiments, the method 1200 further includes operations of outputting the delay signal, for example, DS0, when the number of bits in the address represents a first number, for example, 0 (e.g., XA[MSB,MSB−1]=00). The method 1200 further includes operations of outputting the delay signal, for example, DS1, when the number of bits in the address represents a second number greater than the first number, for example, 1 (e.g., XA[MSB,MSB−1]=01).

In operation 1203, the logic circuit 430 performs the AND operation of the signal BLPRE_F and the signal BLPRE_R to generate the pre-charge signal BLPRE.

In operation 1204, in the read operation to the weight, the pre-charging circuit 145 charges, the bit line BL coupled to the memory cell MC storing a bit of the weight in the memory array 110 in response to the pre-charge signal BLPRE.

In some embodiments, as shown in FIG. 3, the method 1200 further includes operations of charging the bit line BL to have the voltage Vread0 when the number of bits in the address represents a first number, for example, 0 (e.g., XA[MSB,MSB−1]=00). The method 1200 further includes operations of charging the bit line BL to have the voltage Vread1 when the number of bits in the address represents a second number, for example, 1 (e.g., XA[MSB,MSB−1]=01).

The present application provides a memory device that features storing weights for the neural network according to access-frequency of weights and charging bit line according to position of accessed memory cells of weights to be read. It exploits the access-frequency of weight data of CNN and the near-far effect of bit-lines during memory read-out by dynamically modulating bit-line pre-charge time to pre-charge the bit-line to different voltages, reducing read energy, while not degrading the read-out yield and through-put.

Also disclosed is a memory device. The memory device includes a memory array configured to store a plurality of weights; a pre-charging circuit coupled to the memory array through a plurality of data lines, and configured to charge, in response to a pre-charge signal, at least one data line in the plurality of data lines to a read voltage in a read operation to one in the plurality of weights; and a calibration circuit configured to generate the pre-charge signal according to an address of the one in the plurality of weights.

Also disclosed is a memory device. The memory device includes a memory array comprising a plurality of portions each storing a corresponding group of weights in a plurality of groups, wherein the plurality of portions extend in a first direction and are arranged in order along a second direction different from the first direction; and a pre-charge circuit configured to charge a data line, coupled to the plurality of portions, for a first duration to reach a first voltage in a read operation to a first memory cell in a first portion of the plurality of portions, and configured to charge the data line for a second duration different from the first duration to reach a second voltage different from the first voltage in the read operation to a second memory cell in a second portion of the plurality of portions.

Also disclosed is a method of operating a memory device. The method includes: generating, by a delay chain, a plurality of delay signals different from each other in response to a first signal; selectively outputting, by a first multiplexer, one of the plurality of delay signals as a second signal according to a number of bits in an address associated with a weight stored in a memory array; performing, by a logic circuit, an AND operation of the first and second signals to generate a pre-charge signal; and in a read operation to the weight, charging, by a pre-charging circuit, a data line coupled to a memory cell, storing a bit of the weight, in the memory array in response to the pre-charge signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a memory array configured to store a plurality of weights;

a pre-charging circuit coupled to the memory array through a plurality of data lines, and configured to charge, in response to a pre-charge signal, at least one data line in the plurality of data lines to a read voltage in a read operation to one in the plurality of weights; and a calibration circuit configured to generate the pre-charge signal having a first pulse width according to an address of a first weight in the plurality of weights or generate the pre-charge signal having a second pulse width according to an address of a second weight in the plurality of weights, wherein the first pulse width and the second pulse width are different from each other.

2. The memory device of claim 1, wherein the calibration circuit is further configured to generate the pre-charge signal having the first pulse width in the read operation to the first weight, wherein the first weight is stored in a first portion of the memory array, wherein the calibration circuit is further configured to generate the pre-charge signal having the second pulse width in the read operation to the second weight, wherein the second weight is stored in a second portion, different from the first portion, of the memory array.

3. The memory device of claim 2, further comprising:

an input/output (I/O) circuit coupled to the pre-charge circuit, wherein the second portion is arranged closer to the I/O circuit than the first portion.

4. The memory device of claim 3, wherein the first pulse width is larger than the second pulse width.

5. The memory device of claim 2, wherein a most significant bit (MSB) of the first weight is stored in a first memory cell in the first portion, and a least significant bit (LSB) of the first weight is stored in a second memory cell in the first portion, wherein the first memory cell and the second memory cells are a first distance and a second distance apart from the pre-charge circuit respectively, and the first distance is shorter than the second distance.

6. The memory device of claim 1, wherein in the read operation to a first weight stored in a first portion of the memory array, the pre-charge circuit charges the at least one data line by the read voltage having a first voltage value, and in the read operation to a second weight stored in a second portion of the memory array, the pre-charge circuit charges the at least one data line by the read voltage having a second voltage value smaller than the first voltage value.

7. The memory device of claim 6, wherein a first group, including the first weight and stored in the first portion of the memory array, in the plurality of weights correspond to first frequent access weights for a neural network, wherein a second group, including the second weight and stored in the second portion of the memory array, in the plurality of weights correspond to second frequent access weights for a neural network.

8. The memory device of claim 6, wherein a first group, including the first weight and stored in the first portion of the memory array, in the plurality of weights correspond to weights used for a first layer in a neural network, a second group, including the second weight and stored in the second portion of the memory array, in the plurality of weights correspond to weights used for a second layer in a neural network.

9. The memory device of claim 1, wherein the calibration circuit comprises:

a delay chain configured to generate, in response to a first signal, a plurality of delay signals;

a first multiplexer circuit configured to output, in response to a selection signal associated with the address of one of the first and second weights, one of the plurality of delay signals as a second signal; and a logic circuit configured to generate the pre-charge signal in response to the first signal and the second signal.

10. The memory device of claim 9, wherein the calibration circuit further comprises:

a selection circuit configured to generate the selection signal based on a calibration table, the address of one of the first and second weights, and an index signal, wherein the calibration table is associated with the address of one of the first and second weights and an index transmitted through the index signal.

11. The memory device of claim 10, wherein the selection circuit comprises:

a flip-flop circuit configured to output, in response to a number of bits in the address of one of the first and second weights, the index; and a second multiplexer circuit coupled to the flip-flop circuit, and configured to transmit, in response to the number of bits in the address of one of the first and second weights, the index as the selection signal to the first multiplexer circuit.

12. A memory device, comprising:

a memory array configured to store a plurality of weights;

a pre-charging circuit coupled to the memory array through a plurality of data lines, and configured to:

charge, in response to a pre-charge signal, the data line in the plurality of data lines to a first read voltage for a first duration in a read operation to a first weight in the plurality of weights; and charge, in response to the pre-charge signal, the data line in the plurality of data lines to a second read voltage for a second duration in the read operation to a second weight in the plurality of weights, wherein the first duration is different from the second duration; and a calibration circuit configured to generate the pre-charge signal according to an address of one of the first and second weights in the plurality of weights.

13. The memory device of claim 12, wherein the calibration circuit is further configured to generate, according to the address of the first weight in the plurality of weights, the pre-charge signal having a first pulse width in the read operation to the first weight, the first weight stored in a first portion of the memory array.

14. The memory device of claim 13, wherein the calibration circuit is further configured to generate, according to an address of the second weight in the plurality of weights, the pre-charge signal having a second pulse width in the read operation to the second weight, the second weight stored in a second portion, different from the first portion, of the memory array, wherein the first pulse width is larger than the second pulse width.

15. The memory device of claim 14, wherein the second portion is interposed between the pre-charge circuit and the first portion.

16. The memory device of claim 15, wherein the first duration is longer than the second duration.

17. A memory device, comprising:

a memory array configured to store a plurality of weights;

a pre-charging circuit coupled to the memory array through a plurality of data lines, and configured to charge, in response to a pre-charge signal, at least one data line in the plurality of data lines to a read voltage in a read operation to one in the plurality of weights; and a calibration circuit configured to generate the pre-charge signal having a first pulse width according to an address of a first weight in the plurality of weights or generate the pre-charge signal having a second pulse width according to an address of a second weight in the plurality of weights, wherein the first pulse width and the second pulse width are different from each other, wherein the first weight is stored in a first portion of the memory array, and the second weight is stored in a second portion, different from the first portion, of the memory array.

18. The memory device of claim 17, wherein the calibration circuit comprises:

a delay chain configured to generate, in response to a first signal from the calibration circuit, a plurality of delay signals;

a multiplexer circuit configured output, in response to a selection signal associated with the address of one of the first and second weights, one of the plurality of delay signals as a second signal; and a logic circuit configured to generate the pre-charge signal in response to the first signal and the second signal.

19. The memory device of claim 18, wherein the delay chain inverts the first signal to generate a first delay signal in the plurality of delay signals and to sequentially delay the first delay signal to generate remaining delay signals in the plurality of delay signals.

20. The memory device of claim 18, wherein multiplexer circuit is further configured to output a first delay signal in the plurality of delay signals when the number of bits in the address of one of the first and second weights represents a first number, and to output a second delay signal, in the plurality of delay signals and different from the first delay signal, when the number of bits in the address of one of the first and second weights represents a second number greater than the first number.

* * * * *